United States Patent [19]

Cases et al.

[11] Patent Number: 4,500,800
[45] Date of Patent: Feb. 19, 1985

[54] LOGIC PERFORMING CELL FOR USE IN ARRAY STRUCTURES

[75] Inventors: Moises Cases, Delray Beach; Wayne R. Kraft; William L. Stahl, Jr., both of Coral Springs; Nandor G. Thoma, Boca Raton, all of Fla.

[73] Assignee: International Business Machines Corporation, Armonk, N.Y.

[21] Appl. No.: 413,043

[22] Filed: Aug. 30, 1982

[51] Int. Cl.³ ............... H03K 19/017; H03K 19/096; H03K 17/16; H03K 19/177
[52] U.S. Cl. .................. 307/468; 307/443; 307/481; 307/577; 364/716; 377/58; 377/61
[58] Field of Search ............ 307/468, 469, 475, 572, 307/577, 581, 450, 481; 364/716; 377/57, 58, 60, 61

[56] References Cited

U.S. PATENT DOCUMENTS

| | | | |
|---|---|---|---|
| 4,123,669 | 10/1978 | Devine et al. | 307/468 X |
| 4,130,766 | 12/1978 | Patel et al. | 377/57 |
| 4,140,921 | 2/1979 | Balasubramanian et al. | 307/468 |
| 4,183,093 | 1/1980 | Kawagoe | 307/469 X |
| 4,208,728 | 6/1980 | Blahut et al. | 307/469 X |
| 4,295,064 | 10/1981 | Schuster | 307/468 |
| 4,393,318 | 7/1983 | Takahashi et al. | 307/577 X |

Primary Examiner—Larry N. Anagnos
Attorney, Agent, or Firm—Robert Lieber

[57] ABSTRACT

As a specific improvement to a previously known PLA (Programmed Logic Array) structure, formed by FET devices in serially chained charge transfer circuits, the presently disclosed "modified" PLA structure comprises a combination of: (a) level shifting circuitry, integrated into bit partitioning stages of the known structure, for reducing voltage swings in the outputs of those stages and thereby reducing spurious couplings to the following AND array stage as well as decreasing operational delays of the latter stage; (b) discrete capacitance, added at the output end of the OR array stage of the known structure, for sustaining and reinforcing charge conditions accumulated in that stage prior to readout (validation clocking) of that stage; and (c) a source of time related clocking functions coupled to stages of the modified structure, with the timing relationships selected so as to reduce operational delays of the entire structure while improving its integrity of operation.

4 Claims, 7 Drawing Figures

FIG. 1  PRIOR ART (REFERENCE) PLA STRUCTURE

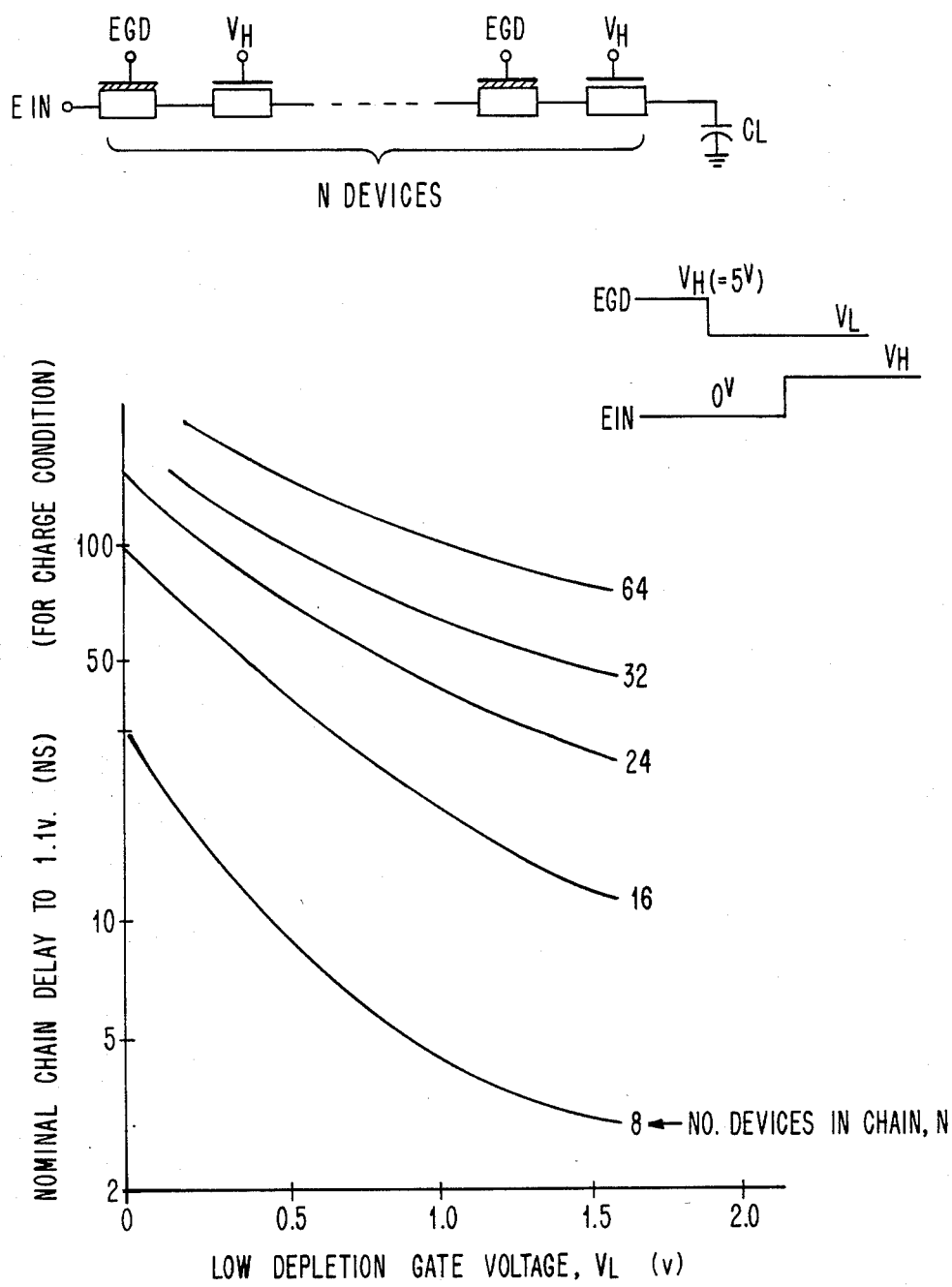
FIG. 5 COMPUTER SIMULATION RESULTS FOR CHAIN CHARGING TIME

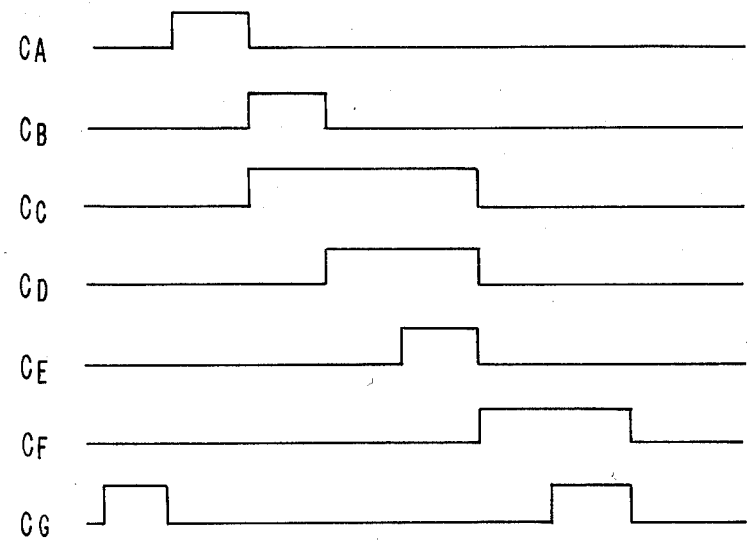
REFERRING TO FIG. 2:
$C_A = C_{d1}$
$C_B = C_{p2}$
$C_C = C_{v1} = C_{C2}$
$C_D = C_{C1} = C_{v2}$
$C_E = C_{p3}$
$C_F = C_{d2}$
$C_G = C_{v3} = C_{p1}$
NOTE:
$C_{p1}$ = OPTIONAL, i.e., COULD USE DEPLETION LOADS IN BIT PARTITIONERS FOR PERFORMANCE CONSIDERATIONS.
FIG. 6 — CLOCKING SYSTEM

LOGIC PERFORMING CELL FOR USE IN ARRAY STRUCTURES

CROSS REFERENCE TO RELATED APPLICATION

Copending patent application Ser. No. 203,170 by M. Cases et al—filed Nov. 3, 1980, now U.S. Pat. No. 4,395,646, entitled "A Logic Performing Cell For Use In Array Structures", and assigned to the same assignee as this application—discloses a "chained cell" programmable logic array (PLA) structure which represents an environmental or "basic" PLA structure improvable by the present invention. This structure comprises FET devices arranged in serially chained circuit configurations in each of which cell packaging density is effectively increased by elimination of ground diffusion contacts relative to individual cells.

BACKGROUND OF THE INVENTION

Although the basic PLA structure described in the above-referenced earlier application by Cases et al has distinct packaging density advantages, charge transfer delays incurred as a result of the serial chaining of device cells in that structure tend to limit its cost/performance attractiveness as a design option. The purpose of the present invention is to provide a combination of specific improvements to such "chained cell" PLA structures which together significantly improve the performance and operational integrity of such structures, although when introduced separately they would tend to provide only relatively minor benefits.

SUMMARY OF THE INVENTION

In accordance with the present invention the basic structure of the referenced earlier application by Cases et al is augmented by a combination of features which are effective jointly to provide significant reductions in operational delays as well as improved integrity of operation. These features comprise: (a) integration of level shifting circuitry into the bit partitioning stages of the basic structure for reducing voltage swings at outputs of those stages, thereby reducing magnitudes of spurious couplings to circuits in the following AND array stage as well as decreasing operational delays of that stage; (b) introduction of discrete capacitance at a predetermined output position of the OR array stage for sustaining and reinforcing charge conditions developed in that stage during periods of readout (validation clocking); and (c) application of uniquely timed clocking functions to the partitioning, AND array and OR array stages for speeding up cycles of information transfer through the structure without loss of operational integrity.

These and other features and objectives of the present invention will be more fully understood and appreciated by considering the following description and claims.

BRIEF DESCRIPTION OF THE DRAWING

FIG. 5 illustrates relationships between chain charging delays in the AND array and lower limit gate voltages produced by level shifting in the partitioning stages;

FIG. 6 illustrates timing relationships between clocking signals named in FIG. 2.

DETAILED DESCRIPTION

Figure 1:
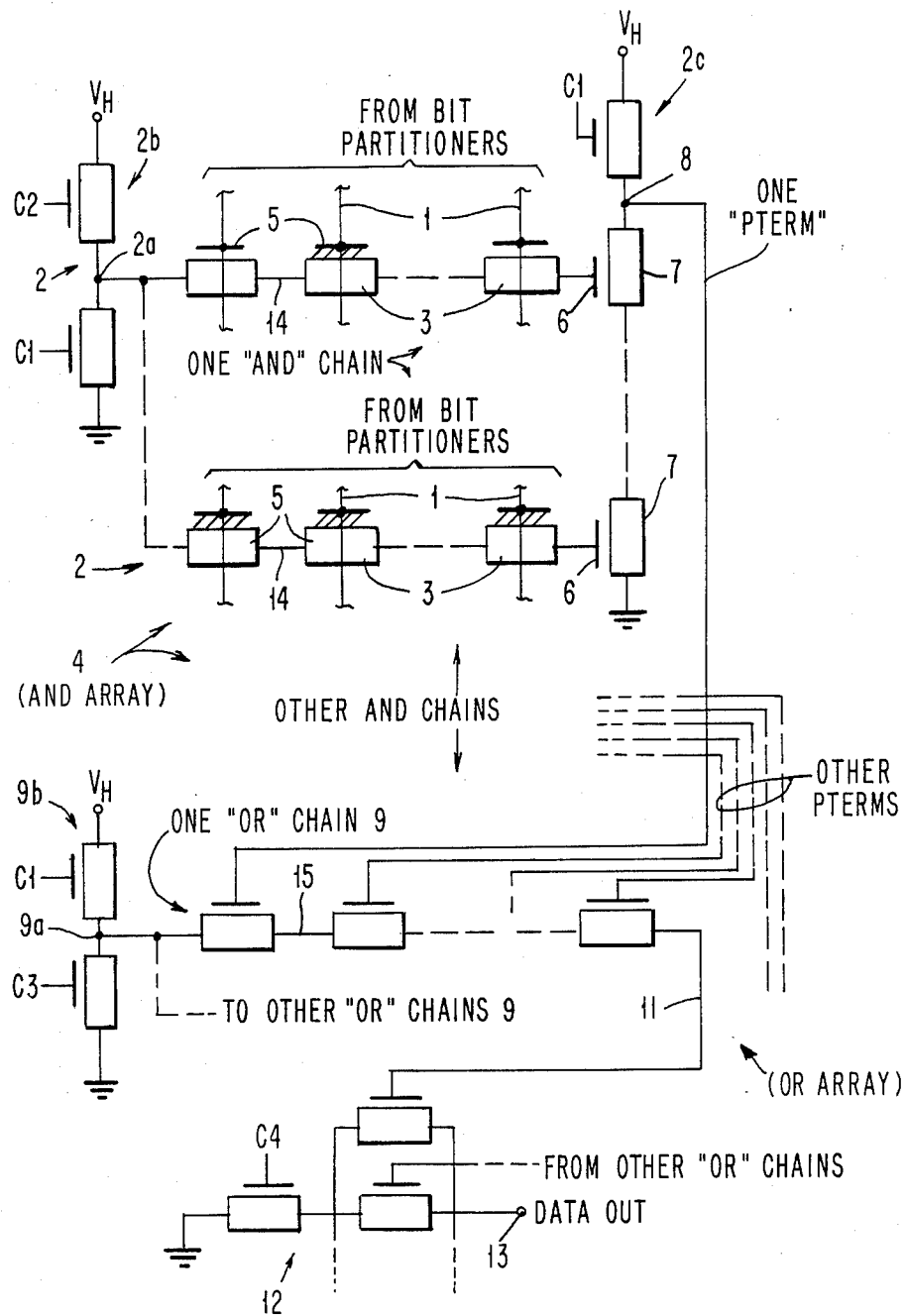
FIG. 1 schematically illustrates the "basic" prior art PLA structure which is improved hereby.

Referring to FIG. 1, in a basic PLA structure improvable by the present invention data/control signal input lines 1 extend vertically, from (not shown) "bit partitioner" circuits known in the art (refer e.g. to U.S. Pat. No. 3,761,902 granted to A. Weinberger on Sept. 25, 1973), across rows 2 of serially connected FET devices 3 which form discrete "AND" logic (or product term) elements within an aggregate AND logic array.

The bit partitioning circuits perform decoding translation functions on groups of signals which represent inputs to the structure. Some of the input groups may contain only a single bit and other groups may contain two or more bits. A partitioning stage circuit receiving a single input bit provides a pair of outputs which represent logically the true and complement of the input bit value. A partitioning stage circuit having n (greater than 1) inputs has $2^n$ outputs which are activated in correspondence with all possible "AND" combinations of permuted conditions of the inputs (i.e. if a two-input group consists of binary representations A and B, the partitioner has four outputs activated to represent $A.B$, $A.\bar{B}$, $\bar{A}.B$ and $\bar{A}.\bar{B}$).

Each row 2 contains serially connected FET devices such as 3 at each column intersection with the partitioner output lines 1. In each row, gate regions 5 of these devices are variously formed in the manufacturing process to operate in enhancement and depletion modes depending on the AND function specifically required at that row (i.e. as pre-specified by the logic designer). Each depletion mode device provides a low impedance within respective serial row circuit for either binary condition or state of the respective column input. However, each enhancement mode device variably presents high or low serial impedance depending on the binary 0 or 1 voltage condition at its respective column input. Accordingly, the enhancement mode devices in any row/chain act to form the logical product (AND) of the respective column input functions, while depletion devices in the same row operate as "don't care" linkages relative to respective column inputs. The depletion mode devices in a row are indicated symbolically by hatch marks between the gate 5 and the diffusion "body" of the device.

Each row circuit 2 in the AND array extends between an output node 2a in a control circuit 2b and the gate 6 of a device 7 in an output buffer circuit 2c. A single AND function may be split among plural chain circuits 2 (to reduce operational delays associated with serial circuits of excessive length), these having differently positioned enhancement gate regions, as suggested in FIG. 1. Accordingly, the output 8 of each output buffer circuit 2c represents a single product (AND) term (PTERM). Such PTERM's may be OR'd variously in the OR array stage described below.

Each control circuit 2b is controlled by time exclusive clocking signal functions C1 and C2. When "discharging clock" C1 is active the left end of the respective chain circuit is connected to a low reference potential (ground), causing any charges previously accumulated in the devices of that chain to be discharged, and when "validation clock" C2 is active the left end of the chain is effectively connected to a high voltage reference ($V_H$) causing the enhancement mode devices in the chain to accumulate charges conditionally—i.e. if and only if all of their inputs are coincidentally at voltage levels which represent "logical 1" conditions.

Lines extending from outputs 8 of AND array 4 traverse serial row circuits 9 in an OR array 10. Each circuit 9 contains enhancement mode FET diffusions at active intersections and depletion mode diffusions at inactive or "don't care" intersections. These operate collectively to transfer a charge condition to the output end 11 which at appropriate validation clocking instants of time bear a "sum of products" relation to the PTERM functions applied to the gates of its enhancement diffusions.

Each OR chain circuit 9 extends between output node 9a of a respective control circuit 9b and a device gate in one or more output buffer circuits 12. The circuits 12 have respective outputs 13 which represent sum of product functions. Plural circuits 12 operate collectively to produce plural outputs 13 which represent the aggregate of all functional outputs of the respective PLA structure. Circuits 9b are controlled by precharging clock function C1 to precharge the respective chain 9 and by validation clock function C3 to conditionally discharge the respective chain.

The foregoing partitioning circuit, AND array and OR array in combination form a "basic" PLA structure now known in the art. Inputs 1 to such structures, which represent data and control functions, are developed from outputs 13 of the same structure and from other sources (circuits, other PLA structures, memories, etc.). Such structures and their sources and sinks form cyclically operative data processing systems and networks. The clocking signal functions C1, C2, C3 and C4 in the illustrated structure are used as follows.

During C1 active time, input lines 1 (bit partitioner outputs) are held high which results in a complete discharge of the "AND" array chain. C1 also precharges the devices 7 in buffer circuits C2, as well as the OR array chains 9. C2 conditionally charges (validates) AND chains 2 and establishes respective PTERM outputs 8 at validated (logically appropriate) levels.

C3 validates the OR chains 9 and inputs to output buffers 12. C4 validates the OR array outputs 13. The expression "precharge" above is meant to imply that pertinent nodes are brought to a voltage level $V_H - V_T$, where $V_T$ is the enhancement threshold voltage.

Timing of these operations is important. The operational integrity of such serially chained charge transfer type dynamic PLA structures would be adversely affected by excessive spurious coupling effects (into the AND stage during validation clocking of the bit partitioners, and into the OR stage during validation of the AND stage). In general, the voltage coupled to each AND or OR chain is primarily a function of voltage swings at gates of the FET devices (cells) in the chain, and of ratios of parasitic diffusion capacitance at cell nodes to overlap gate capacitances at respective nodes. More specifically, during the validation of the bit partitioner (subsequent to discharge of the AND array chains), the activated outputs (input lines 1) start to fall causing negative capacitive coupling to appropriate nodes 14 in the AND array chains. These nodes dip below ground level, causing longer charging times during the subsequent validation of the AND array chains.

Similar effects occur in the OR chains during validation of the AND chains. In the illustrated structure (FIG. 1), cells in the OR chains precharge prior to validation clocking of the AND chains. Then, during AND chain validation, activated PTERM outputs 8 start to fall causing negative capacitive coupling to associated OR chain nodes 15. Under specific conditions (e.g. a multiplicity of PTERMS becoming active), this coupling effect, along with charge redistribution, may cause a partial or complete false discharge of the accumulated precharge in the respective OR chain. Consequently, during subsequent validation of the respective OR chain, it may not be possible to refurnish the lost charge. When this occurs, associated OR array outputs 13 will have erroneous logical states.

By modification of the illustrated PLA structure in accordance with the present invention, these spurious coupling problems are significantly alleviated and periods required to be allowed for validation clocking through all stages may be considerably shortened. These modifications are suggested in FIG. 2. Referring to this figure, a presently modified PLA structure possesses the following features:

(1) The bit partitioning stage contains special level shifting bit partitioner circuits 21 which in addition to the necessary partitioning translations provide voltage level shifts which impose a positive limit on "down" level voltage $V_L$ applied to the devices in the following AND chains 24. This results in depletion mode (don't care) devices 25 receiving increased drive from "down level" inputs (than corresponding devices in the FIG. 1 structure), and thereby presenting smaller impedance differences during validation, and AND chains 24 receiving reduced spurious coupling (because of the reduced voltage swing $V_H - V_L$). The level shifting partitions circuits 21 are illustrated for single bit partitioners with level shifted true and complement outputs 21a and 21b. Details of a suitable circuit implementation are given in FIG. 3(a). Extensions to partitioners for decoding two or more bits will be apparent from the discussion of FIG. 3(b).

(2) The precharging control device 26 for each OR chain 27 is positioned at the output end of the chain (left end in FIG. 2) to speed up recharging of the chain during periods of validation of the AND chain PTERM outputs 28.

(3) Discrete capacitance 29 introduced at the output end of each OR chain sustains and reinforces charges developed during the PTERM validation period.

(4) A system of clocking functions Cp1-Cv3 with unique time spacings and overlaps reduces the time required to be allowed between corresponding validations of the partitioning AND and OR stages.

Figure 2:
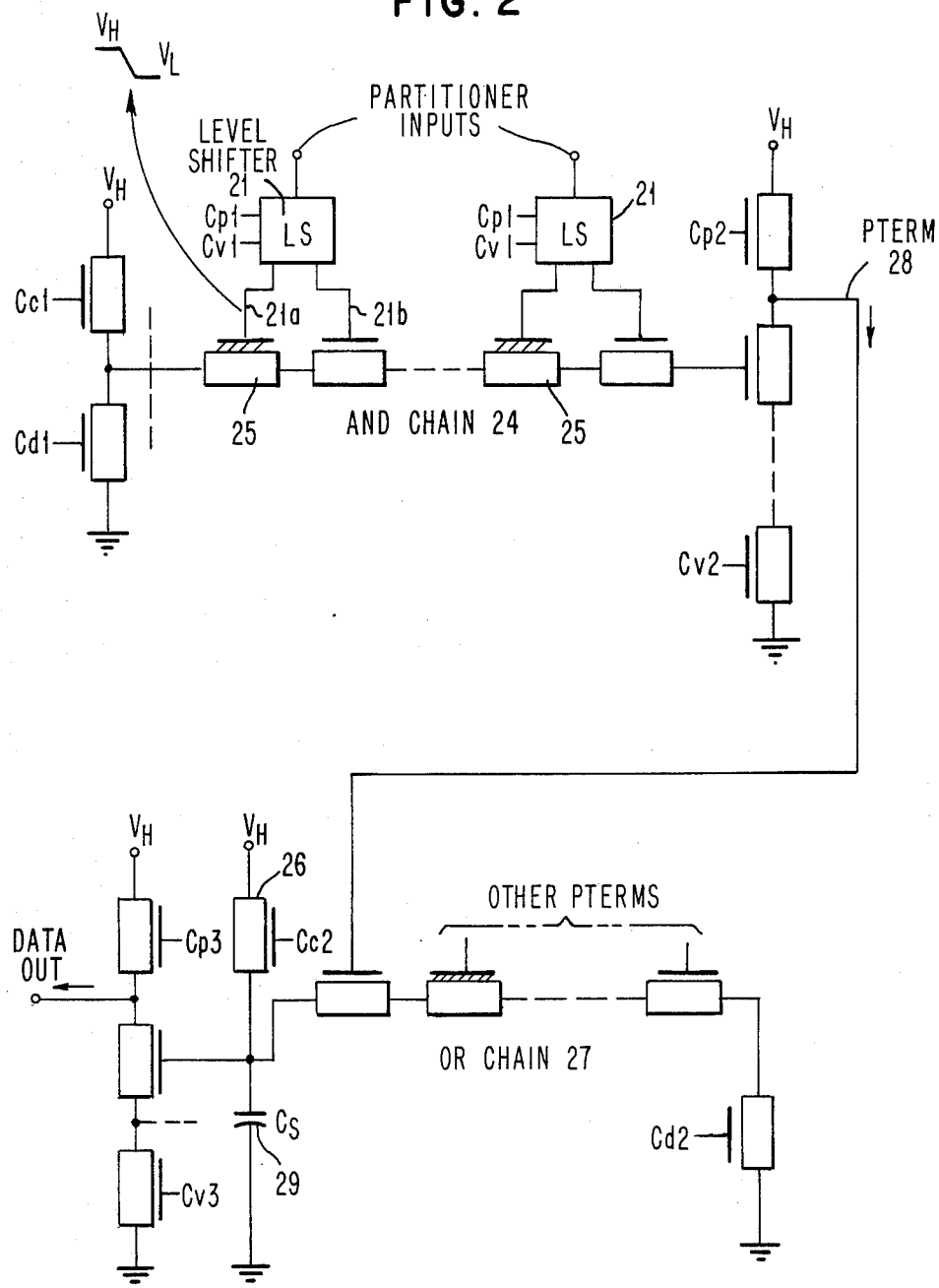
FIG. 2 illustrates schematically how the structure of FIG. 1 is modified in accordance with the present invention.

Referring to FIG. 6, clock functions $C_D$ represents both clock Cc1 of FIG. 2 for controlling AND chain charging, and clock Cv2 of FIG. 2 for validating the PTERM outputs of the AND array. This coincidence allows the AND chains to continue to charge during PTERM validation and ensures stable PTERM outputs. Clock function $C_C$ in FIG. 6 represents both the partitioner validation clock Cv1 and the OR chain precharge clock Cc2 of FIG. 2, and overlaps clock function $C_D$ in time. Consequently, the OR chain charging action is stable during PTERM validation and the integrity of information transfer to the OR chain is unaffected by negative PTERM transients. OR chain output validation clock Cd2 (function $C_F$ in FIG. 6) is stretched to overlap the OR output validation clock, Cv3 (function $C_G$ in FIG. 6), allowing OR chain validation actions to complete while associated final OR outputs are being validated. Cv3 also coincides with partitioner stage precharge clock Cp1, allowing the next cycle of informational charge transfer through the presently modified structure to begin while the previous cycle output is being validated.

Figure 3A:
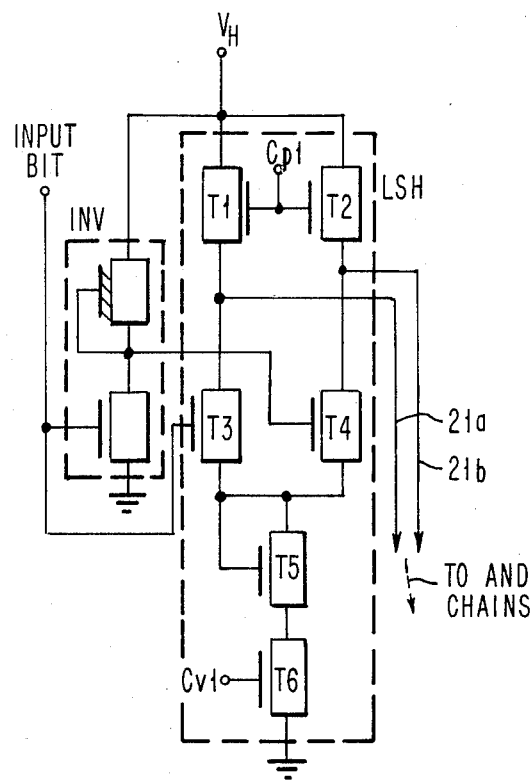
FIGS. 3(a) and 3(b) specifically illustrate, in a preferred circuit embodiment, a technique for providing level shifting respectively in single bit partitioning stages and two-bit partitioning stages of the basic structure in accordance with the present invention.
Figure 4:
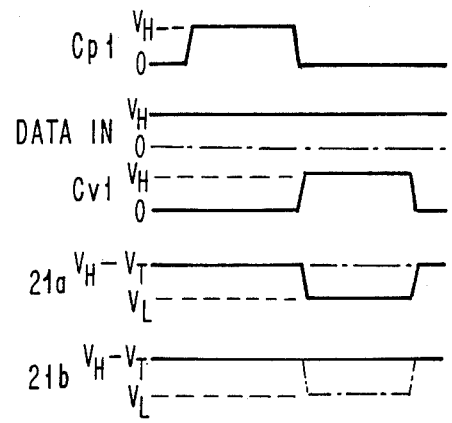
FIG. 4 illustrates relationships between various signal parameters in FIG. 3(a) for explaining the operations of the circuits in both FIGS. 3(a) and 3(b)
Figure 3B:
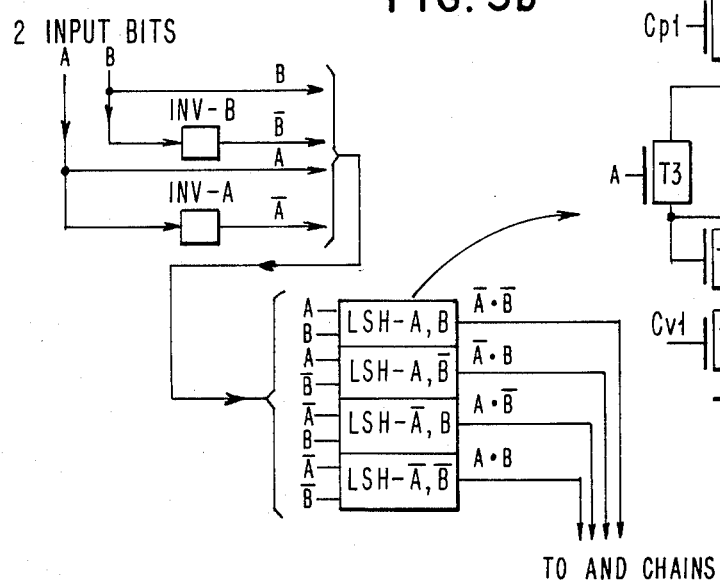

FIGS. 3(a) and 4 respectively illustrate a preferred embodiment of a suitable single bit partitioner circuit with integral level shifting and its operational timing. FIG. 3(b) discussed later illustrates an equivalent two bit partitioner with level shifting as well as the technique for constructing equivalent level shifters for three or more bit partitioners.

Referring to FIG. 3(a) the single bit partitioner comprises an inverting stage INV and a level shifting stage LSH. The single phase input bit is inverted by INV, and its true and complement phases are applied respectively to gates of devices T3 and T4 in LSH. Referring to FIGS. 3(a) and 4, when Cv1 is low and Cp1 is high outputs 21a and 21b of LSH charge to high voltage levels $V_H - V_T$ through respective devices T1 and T2. Thereafter, when Cv1 rises, devices T5 and T6 and one of the devices T3 or T4 conduct (T3 if the input bit is high and T4 if the input bit is low) causing one of the outputs 21a or 21b to drop to a lower but still positive voltage level $V_L$. At this time, device T5 acts like a resistor of value 1/gm, where gm is the $V_{GS}$-to-$I_{DS}$ transconductance of the device, producing the positive voltage drop which establishes the level of $V_L$. Since this drop is a function primarily of the device geometry, i.e. its width to length ratio, it should be understood that the magnitude of $V_L$ can be adjusted for different structures and performance requirements within a reasonable range (by relatively minor variations in the manufacturing process). Furthermore it should be understood that in appropriate applications devices T1 and T2 could be replaced by unclocked depletion mode devices to increase the upper level voltage $V_H - V_T$ and thereby increase the voltage swing (for enhanced performance) while continuing to limit the down level voltage (for reduced spurious coupling to following AND stages).

FIG. 5 shows data (obtained by computer simulation) representing relationships between chain charging delays and cell population over a range of lower limit voltages $V_L$. The point to note here is that for any given cell population, charging delays are inversely related to the magnitude of $V_L$. Hence, PLA performance can be enhanced by establishing suitable values for $V_L$ and cell population per chain.

FIG. 3(b) indicates an equivalent two-bit partitioner with integral level shifting. Each input bit A and B is inverted in a respective inverting circuit INV (INV-A for input A and INV-B for input B), and true and complement phases of these inputs are "ANDed" in various permutative combinations in level shifter circuits "LSH-" for producing requisite outputs A.B, A.$\overline{B}$, $\overline{A}$.B and $\overline{A}$.$\overline{B}$. The circuits LSH- are identical except for their inputs. Representative details of LSH-A,B illustrated in this figure, reveal that these circuits differ slightly from the circuit LSH used for single bit partitioning (FIG. 3(a)), in that they contain only a single precharging device T1 and only a single output ($\overline{A.B}$ in the representative illustration). Operation of such two bit partitioner circuits will be immediately apparent from the description given above of single bit partitioner operation. Furthermore, techniques for constructing level shifting bit partitioners with three or more inputs should be equally apparent.

Referring again to FIGS. 2 and 6, it should be understood that the introduction of level shifting in the bit partitioning stages and discrete charging capacitance 29 in the OR chains permits successive stages of the modified PLA structure to be clocked at a "tighter" timing schedule without loss of operational integrity. This, of course, results in a modified PLA structure having improved performance characteristics. After preparation of the AND chains by Cd1, input charge conditions representing information are clocked through the partitioning stages by partitioner validation clock Cv1. At the same time, the OR chains are prepared by precharging clock Cc2 and the buffer circuits between the AND and OR stages are preparationally charged by Cp2. In time overlap with the precharging of the AND chain devices to informational states, under control of Cc1, the operation for validating the AND chain output is advanced by Cv2. Concurrently, Cc2 precharges the OR chains and their reinforcing capacitors 29. Then OR stage informational output states are validated by Cv3 while Cd2 permits the OR chains to discharge under appropriate information conditions.

While we have illustrated and described a preferred embodiment of our invention, it is to be understood that we do not limit ourselves to the precise constructions herein disclosed and hereby reserve rights to all changes and modifications thereof within the scope of the following claims.

What is claimed is:

1. In a programmed logic array structure having successive stages for performing bit partitioning, logical ANDing and logical ORing operations, with serially chained FET devices in the ANDing and ORing stages, the improvement for speeding up transfers of charges representing bits of information through said structure without loss of operational integrity comprising:

level shifting circuit means contained in said bit partitioning stages for reducing voltage swings occurring at transfer interfaces between outputs of respective bit partitioning stages and inputs to corresponding FET device chains in said ANDing stages, thereby reducing magnitudes of spurious charge coupling effects produced at the devices in said ANDing stages while also facilitating fast clearing of charges previously accumulated by devices in said ANDing stages;

charge reinforcing circuit means coupled to outputs of FET device chains in said ORing stages for sustainably reinforcing charge conditions acquired and held in respective device chains during transfers of outputs of said ORing stage; and clocking circuit means providing a plurality of coordinated and cyclically repetitive timing control signals to said array stages for causing device chains in said stages to charge and discharge in a predetermined "tightly coordinated" manner, whereby charges representing information bits are moved successively and rapidly through devices in said partitioning, ANDing and ORing stages, and yet devices in said device chains in said ANDing and ORing stages are effectively kept isolated from spurious charge conditions created by transitional discharging and charging actions occurring at devices in respective preceding stages.

2. An improved program logic array structure in accordance with claim 1 wherein:

said level shifting circuit means comprises means for positively limiting down level voltages transferred from said partitioning stages to devices in said AND chains so as to effectively reduce operational delays in said AND chains associated with times required to charge and discharge devices therein.

3. An improved logic array structure in accordance with claim 1 wherein:

said ORing stages each having output terminations to buffer circuits interfacing between said chains and final outputs of said logic array structure, and said charge reinforcing circuit means comprises discrete capacitance directly connected to said output terminations and receiving charge from the respective ORing stage.

4. An improved logic array structure in accordance with claim 1 wherein:

said clocking means comprises sources of first, second and third validation clocking signal functions respectively controlling transfers of information representing charge conditions from said partitioning stages to said AND chains, from said AND chains to said OR chains, and from said OR chains to final buffered outputs of said structure; said second validation clocking function overlapping said first validation clocking function in time.

* * * * *